United States Patent
Sakano et al.

(10) Patent No.: US 7,020,401 B2
(45) Date of Patent: Mar. 28, 2006

(54) TRANSPONDER AND WAVELENGTH DIVISION-MULTIPLEXING OPTICAL TRANSMISSION EQUIPMENT

(75) Inventors: Shinji Sakano, Kamakura (JP); Ryuji Ishii, Fujisawa (JP); Yoshinori Yamada, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 590 days.

(21) Appl. No.: 09/943,101

(22) Filed: Aug. 30, 2001

(65) Prior Publication Data
US 2002/0159130 A1    Oct. 31, 2002

(30) Foreign Application Priority Data
Apr. 12, 2001   (JP) ................ 2001-113590

(51) Int. Cl.
*H04B 10/02*   (2006.01)
(52) U.S. Cl. .............. 398/175; 398/176; 398/173; 398/155; 398/154; 398/202; 375/376; 375/374; 375/375; 327/156; 327/159; 331/1 R; 331/17; 331/25; 331/1 A
(58) Field of Classification Search .......... 398/175, 398/176, 155, 154, 202, 173; 375/376, 374, 375/375; 327/156, 159; 331/1 R, 17, 25, 331/1 A
See application file for complete search history.

(56) References Cited

U.S. PATENT DOCUMENTS

| 5,987,085 A | * | 11/1999 | Anderson .............. 375/374 |
| 6,476,953 B1 | * | 11/2002 | Morkel ................. 398/175 |
| 6,501,582 B1 | * | 12/2002 | Chiou et al. ........... 398/126 |
| 6,804,468 B1 | * | 10/2004 | Ukaji et al. ............ 398/175 |

* cited by examiner

*Primary Examiner*—Hanh Phan
(74) *Attorney, Agent, or Firm*—Knoble, Yoshida & Dunleavy, LLC (57) ABSTRACT

A wavelength converter and a wavelength division-multiplexing optical communication apparatus automatically generate clock signals of a specified frequency that match send/receive digital signals and regenerates timing for the send/receive digital signals. The wavelength converter includes: optical/electrical signal converters (2A, 2B) that convert input optical signals into electric digital signals; clock generator circuits (4A, 4B) that automatically identify the transmission mode for digital signals and generate phase-synchronized clocks of a specified frequency that match the signal transmission mode; timing regeneration circuits (6A, 6B) that regenerate clock timing for the digital signals based upon the phase-synchronized clocks from the clock generator circuits; and electric/optical converters (3A, 3B) that convert the digital signals from the timing regeneration circuits into optical signals of a specified wavelength.

15 Claims, 7 Drawing Sheets

| STATE VARIABLE VALUE M | REFERENCE STANDARD OSCILLATOR FREQUENCY (MHz) | FREQUENCY DIVIDER 42 DIVISION RATE N |
|---|---|---|
| 0 | 155.52 | 1 |
| 1 | 155.52 | 4 |
| 3 | 156.25 | 2 |
| 5 | 132.81 | 2 |

FIG. 7

TRANSPONDER AND WAVELENGTH DIVISION-MULTIPLEXING OPTICAL TRANSMISSION EQUIPMENT

BACKGROUND OF THE INVENTION

The present invention is directed to a transponder and wavelength division-multiplexing optical transmission equipment for optical communication. More specifically, it relates to a transponder and wavelength division-multiplexing optical transmission equipment for transmitting wavelength division-multiplexed digital signals.

The explosive growth of the Internet has required various modes of data communication services over communications networks. Communication vendors, for example, are required to transmit various types of signals with different signal transmission rates, transmission formats, and protocols over a single optical network. Signal transmission modes for digital signals that are transmitted over wavelength division-multiplexing networks include, for example, Synchronous Digital Hierarchy (SDH), Synchronous Optical NETwork (SONET), Fast Ethernet (100Base FX), Giga Ethernet (1000Base SX, LX), and Fibre Channel (1.06 GBd, 2.12 GBd). In particular, metropolitan optical networks require a service-providing function capable of frequently changing the signal transmission mode for each wavelength and a circuit-providing function capable of freely changing the connectivity between a sender and a receiver to suit the user's (client) requirements.

Both SDH and SONET, which have principally been used for the transmission of voice signals over conventional networks, have a fixed frame format and fixed data rate signal transmission methods that include communication control overheads. In these transmission modes, the monitoring of transmission quality or monitor of transmission quality, alarm monitoring, and path control are performed by means of transmission quality control bits that are assigned to the frame format. The transmission quality is controlled through the continuous processing of designated signal parts that occur in the digital signal strings. Further, optical networks based on either SDH or SONET have assured high transmission quality at the digital signal level through the execution of "3-regeneration repeat" processing at each node, which regenerates received digital signals in terms of three elements—strength, waveform, and timing—and the relay of the regenerated signals.

Transmission of the multiplexed optical signals in the SDH, SONET, or other digital signal modes over a common optical network requires a maximum transparency, which means transmitting received optical signals in their original form to various nodes and transponders to the maximum possible extent. A high degree of transparency in optical networks enhances their service providing function, reduces the cost of the networks and improves the versatility of the networks. To maintain an optical network's transparency, during the detection of the "0" and "1" signal levels of client digital signals and their conversion into optical signals at a specific wavelength on a wavelength division-multiplexing network, the signal regeneration processing regenerates a signal strength or re-shaping and waveforms using a 2R regeneration. Alternatively, the signal regeneration processing regenerates the digital signal's clock timing in addition to the signal strengths and waveforms using a 3R regeneration.

2R regeneration does not reproduce any degeneration of signal timing and easily satisfies the digital signal transparency requirement. On the other hand, it does not guarantee any regeneration timing. This regeneration can produce temporal fluctuations in the signals that are regenerated and relayed over the network, which results in a reduction in transmission quality. By contrast, 3R regeneration requires the setting of a specific oscillation frequency that is appropriate for the signal transmission mode being used on the phase-locked loop or phase lock loop (PLL) circuit that regenerates the clock timing for received signals. Conventionally, the setting of an oscillation frequency on the PLL is performed externally by predetermining the optical signal transmission rate over the line connecting the client system to the transponder. In optical transmission using a point-multipoint configuration in the asynchronous transfer mode (ATM), a burst (intermittent) transmission method can be employed. In this method, downward signals from a point to multi-points use a continuous pattern. For the upward transfers, signals are transmitted from multiple points only when they are needed. The receiver of the burst signals uses a technique that automatically extracts synchronized regeneration signals from the signals. In such a clock synchronization extraction technique, however, the clock rate is based on the signals received from an upstream source. The synchronization of the burst signals received from a downstream source involves a clock phase synchronization. The problem to be solved in the present invention involves the synchronization of signals that have different clock rates. The synchronization technique contained in the ATM based solely on the use of phases, does not offer any information for the solution of the problem.

In an optical network system in which a transponder is installed between a client equipment and a node so that the changing of signal transmission mode and changing the connectivity between a sender and a receiver can be flexibly performed. In addition, the type of client equipment connected to the transponder is frequently changed. In such a case, it is difficult and costly to externally set a frequency for the PLL circuit for 3R regeneration through human intervention.

SUMMARY OF THE INVENTION

It is an objective of certain embodiments of the present invention to provide a transponder and wavelength division-multiplexing optical transmission equipment so that the process of setting a frequency for a 3R regeneration PLL circuit is automated.

It is another objective of certain embodiments of the present invention is to provide a transponder and wavelength division-multiplexing optical transmission equipment that regenerate a send/receive digital signal based on a detected clock frequency through automatic detection of the clock frequencies that match the send/receive digital signals.

Therefore, in a first aspect, the present invention relates to a transponder includes: an optical/electrical signal converter that converts input optical signals into electric digital signals; a clock generation means or a phase lock loop that automatically identifies the transmission mode of the electric digital signals and generates phase-synchronized clock signals of a specified frequency that matches a given signal transmission mode; a timing regeneration circuit that regenerates clock timing for the electric digital signals; and an electric/optical converter that converts the electric digital signals which are output from the timing regeneration circuit into output optical signals of a specified wavelength for the wavelength division-multiplexed transmission.

Preferably, the clock generation means or phase lock loop of present invention includes, an oscillator that generates phase-controlled clock signals according to the electric digital signals; a frequency divider or dividor that divides the clock signals from the aforementioned oscillator; and an auto-clock controller that changes and controls the division ratio of the frequency divider or dividor at every prescribed cycle, and when the clock frequency of the frequency divider or dividor exhibits a prescribed agreement with a reference clock frequency that depends on the transmission mode of the electric digital signals, the auto-clock controller fixes the division ratio of the frequency divider or dividor.

The wavelength division-multiplexing optical transmission equipment of the present invention includes: a clock generation circuit that automatically identifies the transmission mode of transmitted digital signals and generates phase-synchronized clocks with a prescribed frequency that matches the signal transmission mode; a timing regeneration circuit that regenerates the clock timing for the aforementioned transmitted digital signals based upon the phase-synchronized clocks that are output from the clock generation circuit; and an electric/optical converter that converts the transmission digital signals that are output from the timing regeneration circuit into optical signals of a specified wavelength. The wavelength division-multiplexing transmission equipment multiplexes the optical signals from the electric/optical converter with other optical signals at various wavelengths and transmits them to an optical network.

Preferably the wavelength division-multiplexing optical transmission equipment of the present invention includes: a wavelength separator that separates optical signals of a specified wavelength from the wavelength division-multiplexed optical signals received from the optical network; an optical/electrical signal converter that converts the optical signals received from the wavelength separator into electric digital signals; a clock generator circuit that generates phase-synchronized clocks that match the signal transmission mode; a timing regeneration circuit that regenerates the clock timing for the electric digital signals based upon the phase-synchronized clocks that are output from the clock generator circuit; and an electric/optical converter that converts the digital signals that are output from the timing generator circuit into optical signals at a specified wavelength.

DESCRIPTION OF THE PREFERRED EMBODIMENT

Figure 1:
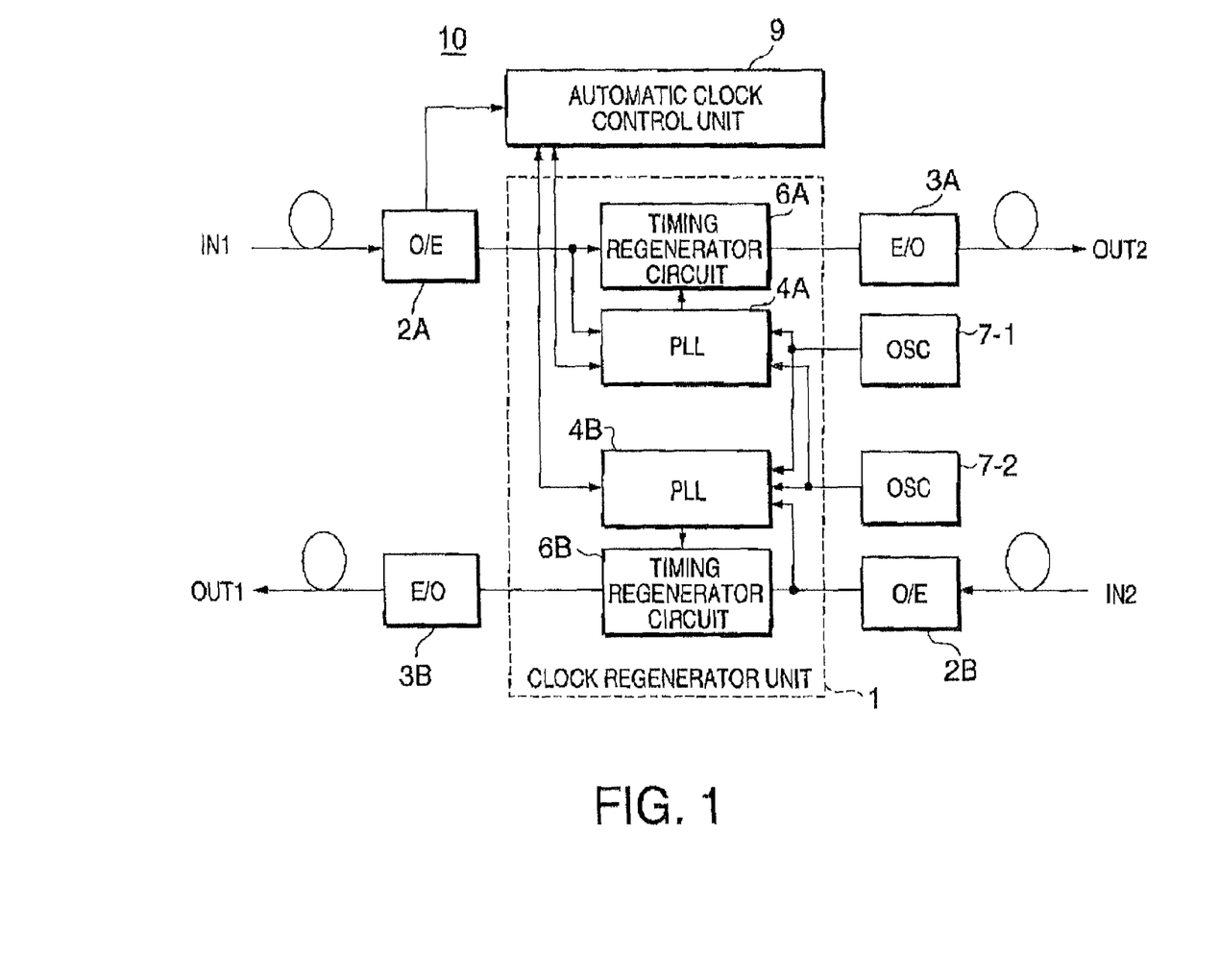
FIG. 1 is a block configuration diagram the transponder having the auto-clock setting function according to the present invention.

FIG. 1 shows a block configuration diagram of the transponder having the auto-clock setting function of the present invention. In the figure, IN1 and OUT1 respectively denote the in and out optical fibers that are connected to the client equipment. IN2 and OUT2 respectively denote the in and out optical fibers that are connected to a wavelength division-multiplexing node apparatus. A clock regenerator unit 1 is controlled by an auto-clock control unit 9.

An O/E (optical signal-to-electric signal) converter 2A converts the client/digital optical signals that are input from the input fiber IN1 into electric digital signals. E/O (electric signal-to-optical signal) converter 3A converts the electric client/digital signals that has been regenerated in the clock regenerator unit 1 into optical signals at a specified wavelength and a desired output level for a wavelength division-multiplexing optical network. The E/O converter 3A outputs the optical signals to the output fiber OUT2. An O/E (optical signal-to-electric signal) converter 2B converts digital optical signals of a specified wavelength that are input from the input fiber IN2 and transmitted from another optical signal source that is connected to the wavelength division-multiplexing optical network into electric digital signals. An E/O (electric signal-to-optical signal) converter 3B converts the electric digital signals that has been regenerated in the clock regenerator unit 1 into optical signals at a specified wavelength and the desired optical output level for the client equipment and outputs them to the optical fiber OUT1. First and second oscillators 7-1 and 7-2 generate reference standard clock signals at mutually different frequencies.

The clock regenerator unit 1 includes a timing regenerator circuit 6A as a means to regenerate the timing for digital signals that travel from the client equipment to the wavelength division-multiplexing node apparatus. The timing regenerator circuit 6A is connected between the O/E converter 2A and the E/O converter 3A. The clock regenerator unit 1 further includes a PLL (phase-synchronized oscillator) circuit 4A that regenerates clock signals that are synchronized with the client/digital signals. The clock regenerator unit 1 further includes a timing regenerator circuit 6B as a means to regenerate the timing for the digital signals traveling from the wavelength division-multiplexing node apparatus to the client equipment. The timing regenerator circuit 6B is connected between the O/E converter 2B and the E/O converter 3B. The clock regenerator unit 1 also includes a PLL circuit 4B that generates clocks of a specified frequency that are synchronized with the optical network digital signals.

The output electric digital signals from the O/E converter 2A are supplied to the PLL circuit 4A and the timing regenerator circuit 6A. When the O/E converter 2A detects an optical input at or above a specified level, the O/E converter 2A indicates to the auto-clock controller 9 that a normal optical input state has been attained. The auto-clock controller 9 then commences an auto-clock setting control operation. The auto-clock setting control operation varies the division ratio of the frequency divider or dividor that is connected to a voltage control transmitter in the PLL circuit 4A in order to sequentially switch the frequency of the PLL output clocks at specified intervals.

If the output frequency of the PLL circuit 4A is not phase-synchronized with the input digital signals at the reference frequency corresponding to the transmission mode of the input digital signals, the auto-clock controller 9 modifies the division ratio of the frequency divider or dividor until the PLL circuit 4A is pulled into a phase-synchronized state at the reference frequency. When the frequency of the output clock from the PLL circuit 4A is a phase-synchronized with the reference frequency within a specified time, the auto-clock controller 9 fixes the division ratio of the frequency divider at that point to stabilize the frequency of the output clock. Based upon the output clock from the PLL circuit 4A, the timing regenerator circuit 6A performs a 3R regeneration of the input digital signals.

Supplied to the PLL circuit 4A are multiple types of reference clocks that correspond to the transmission mode of the input digital signals such as a first reference clock for a Synchronous Transfer Module (STM) and a second reference clock for an Ethernet system. According to the present invention, the switching control (auto-clock setting) of the PLL division ratio by the auto-clock controller 9 is completed when the output clock from the PLL circuit 4A indicates a specified match with either the first reference clock or second reference clock. In other words, when the synchronization of the reference clock and the output clock from the PLL circuit 4A is detected, the PLL division ratio is fixed, and synchronized clocks with a stable frequency are supplied to the timing regenerator circuit 6A.

In FIG. 1, the first oscillator 7-1 and the second oscillator 7-2 are designed to generate the first and second reference clocks as described above. In actual applications, the first or second reference clock signals to be compared with the output clock signals from the PLL circuit (4A or 4B) is generated by dividing the reference clock signals that are output from the oscillators using the frequency divider. In situations, where the signal transmission mode used in the client equipment is limited to one type, only one oscillator is required for generating the needed reference clock signals. On the other hand, if there are three or more signal transmission modes that are allowed on the client equipment, three or more oscillators having the oscillation frequencies corresponding to the signal transmission modes will be required.

With regard to the digital signals that travel from the wavelength division-multiplexing node apparatus to the client equipment, the auto-clock controller 9 performs similar control on the PLL circuit 4B, and clock signals with a frequency that matches the transmission mode of the input digital signals are output from the PLL circuit 4B. A 3R regeneration is performed by the timing regenerator circuit 6B by using those clock signals.

More preferably, a clock regenerator unit 1 is controlled by an automatic clock control unit 9. When the input optical signals from the client equipment and the wavelength division-multiplexing node apparatus are automatically timing-regenerated, the automatic clock control unit 9 controlling the output frequency of the PLL (4A or 4B) through the use of reference clocks corresponding to the signal transmission mode. The auto-clock controller 9 optionally includes a field programmable gate array (FPGA) with a specific sequence control function. Alternatively, it includes a ROM containing a control program and a microprocessor that executes the control program. It is not necessary that the auto-clock controller 9 be mounted on the same board as the clock regenerator unit 1. An alternative configuration is employed wherein the auto-clock controller 9 is mounted on a separate board, and it exchanges control information with the clock regenerator unit through the use of a communication means.

Figure 2:
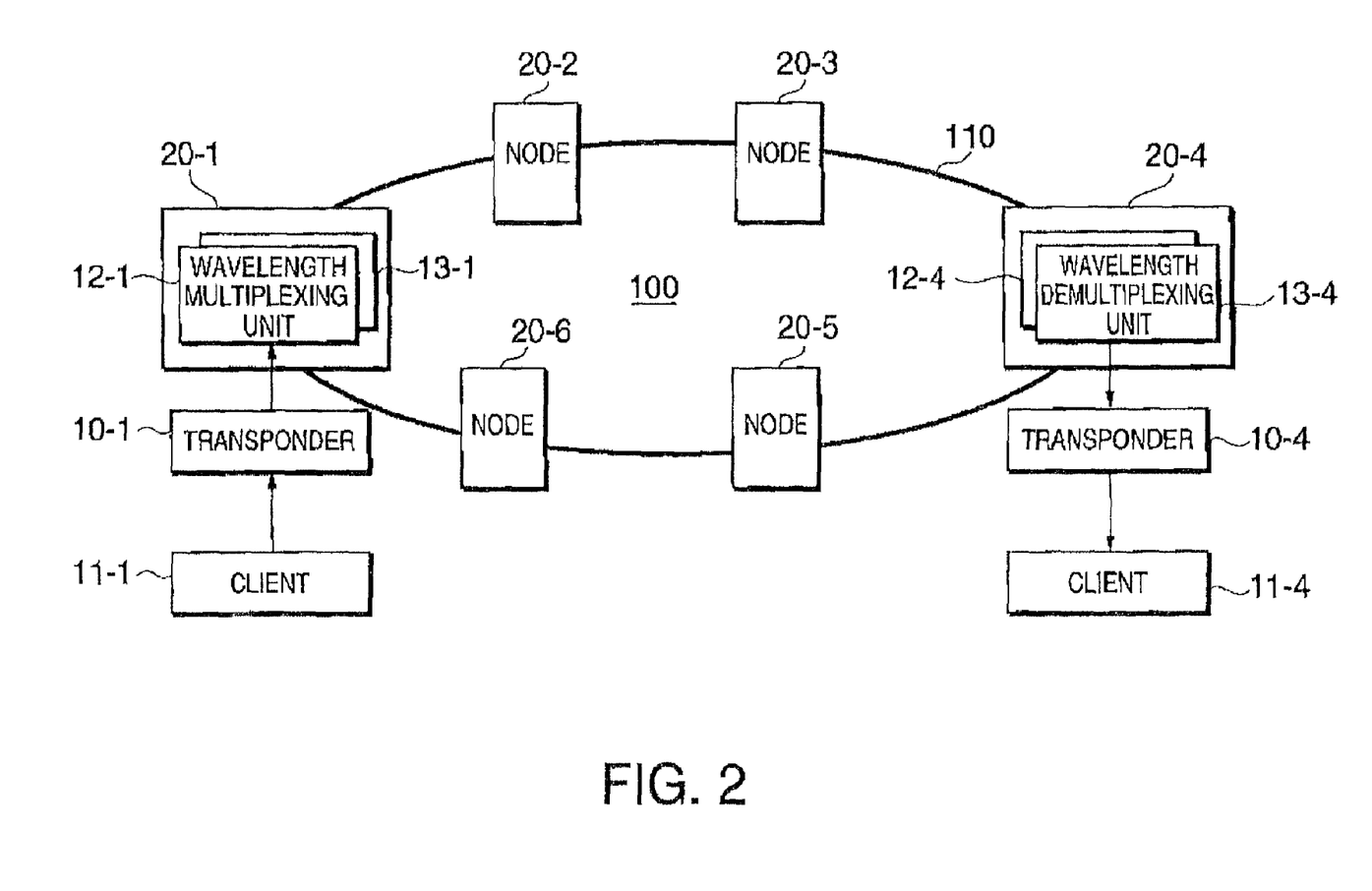
FIG. 2 is a block configuration diagram illustrating a preferred embodiment of the optical network system to which the transponder of the present invention is applied.

FIG. 2 shows a configuration diagram of the optical network system to which the transponder having the auto-clock setting function of the present invention is applied. The wavelength division-multiplexing optical network 100 includes a plurality of wavelength division-multiplexing nodes 20-1 through 20-6, which are connected by optical fibers 110. Client equipment 11-1 and 11-4 is connected to the nodes 20-1 and 20-4 through transponders 10-1 and 10-4. The optical signals generated by the client 11-1 automatically undergo timing regeneration by the transponder 10-1. After being converted into optical signals at a specified wavelength in an enhanced signal quality condition, the optical signals are input into the wavelength division-multiplexing unit 12-1 of the node 20-1. The optical signals at a specified wavelength are wavelength-multiplexed in the wavelength division-multiplexing unit 12-1 with optical signals from other wavelengths that are output from the other transponder (not shown in FIG. 2) and then are transmitted to the optical fiber 110 to propagate through the optical network 100. The optical signals that are output from the transponder 10-1 are separated at a destination node such as the wavelength demultiplexing unit 13-4 of the node 20-4, and they are input into the transponder 10-4. Then the optical signals automatically undergo a timing regeneration at the transponder 10-4. After being converted into optical signals having a client frequency, the optical signals are input into the client equipment 11-4.

Timing regeneration process is optionally performed on both the transmission digital signals traveling from the client equipment to the optical network and the reception digital signals traveling from the optical network to the client equipment. Alternatively in the cases, where signal deterioration is minimal, one of the above timing regeneration processes is eliminated.

Figure 3:
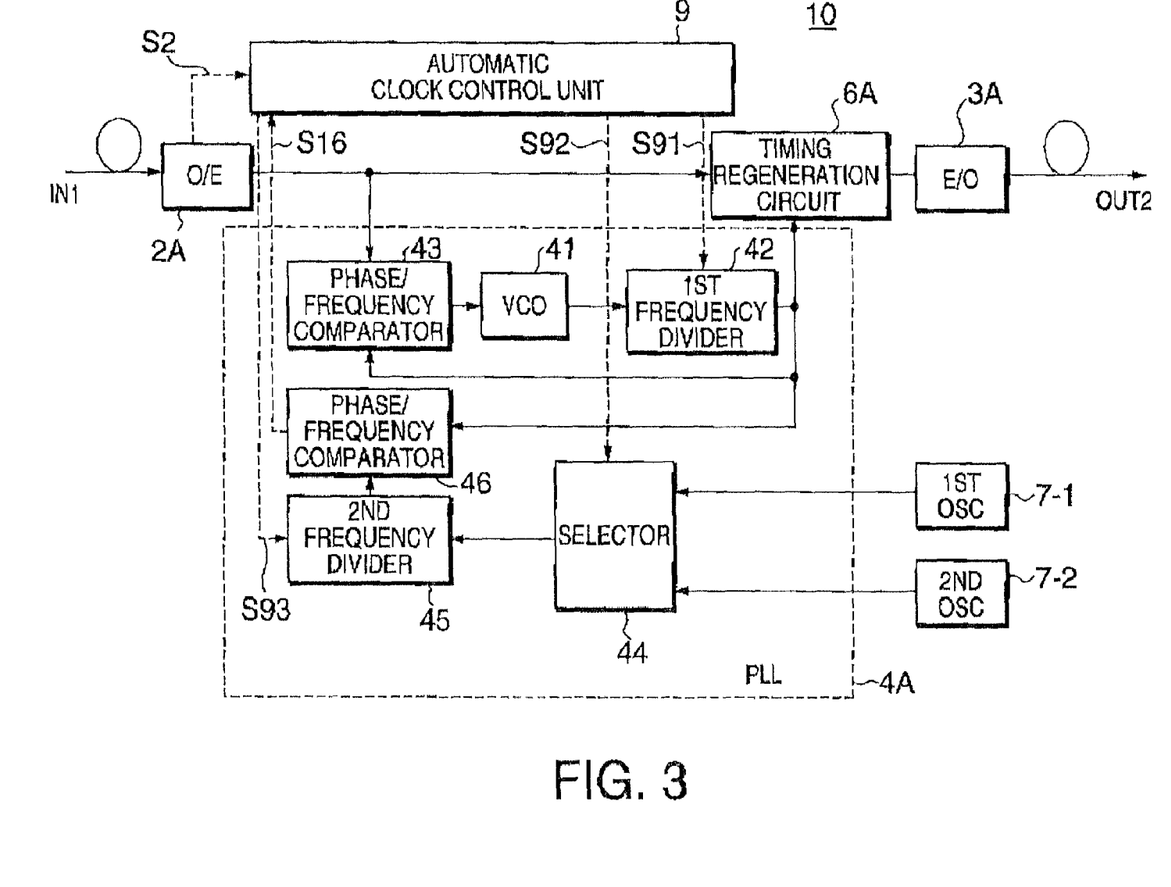
FIG. 3 is a diagram illustrating a first embodiment of the clock regenerator unit of FIG. 1.

FIG. 3 is a diagram illustrating a first embodiment of the clock regenerator unit 1 that was shown in FIG. 1.

Following is a description of the configuration and operation of the PLL circuit 4A for the digital signals that travel from the client equipment to the wavelength division-multiplexing unit. Since the description of PLL circuit 4B of a similar configuration for the digital signals traveling from the wavelength division-multiplexing node apparatus to the client equipment would be the same as that of PLL circuit 4A, it is not repeated.

When a high-level optical input signal beyond a predetermined threshold value is detected in the O/E converter 2A, a detection signal S2 indicating the detection of a transmission signal is input into the auto-clock controller 9, which commences the automatic timing regeneration control. The PLL circuit 4A includes a voltage control oscillator (VCO) 41, a first frequency divider 42 with a variable division ratio that divides the clock signals generated by the VCO 41 by a specified ratio, and a first phase/frequency comparator 43 that compares the frequencies and phases of the electric digital output signals from the O/E converter 2A with the clock output signals from the first frequency divider 42. The oscillation frequency of the VCO 41 is controlled by a control voltage derived from the output signal of the first phase/frequency comparator 43. The division ratio from the first frequency divider 42 is updated by a control signal S91 that is periodically outputted from the auto-clock controller 9. The division ratio of the first frequency divider 42 is fixed when the output clock frequency of the first frequency divider 42 matches the frequency of the reference clock, which will be described later.

For example, the first oscillator 7-1 generates standard clock signals by using a 2.48832 GHz frequency for the SONET. The second oscillator 7-2 generates standard clock signals by using a 1.25 GHz frequency for the Gigabit Ethernet. In this embodiment, the output clocks from the first and second oscillators 7-1 and 7-2 are input into a selector 44. The standard clock signals from either oscillator 7-1 or oscillator 7-2 are selected according to a selection signal S92 from the auto-clock controller 9 and inputted into a second frequency divider 45. For example, in the initial state, the 2.48832 GHz standard clock signals are generated by the first oscillator 7-1 and are selected as well as divided by the second frequency divider 45 for generating a reference clock signal. The division ratio of the second frequency divider 45 is specified by a control signal S93 that is supplied by the auto-clock controller 9.

The reference clock signal is inputted into a second phase/frequency comparator 46 and is compared with the output clock signal from the first frequency divider 42. When the difference between the output clock from the first frequency divider 42 and the reference clock signal falls within an allowable range, the second phase/frequency comparator 46, requests the auto-clock controller 9 to fix or lock the clock by sending signal S16 indicative of a lock notification state. If the difference between the two clock signals exceeds the allowable range, the signal S6 has a un-lock notification state.

Upon detecting that the optical level has attained a normal level through a detection signal S2 from the O/E converter 2A, the auto-clock controller 9, by using control signals S91 and S93, sets an initial division ratio on the first frequency divider 42 and the second frequency divider 45. Furthermore, the auto-clock controller 9 uses a control signal S92 to direct the selector 44 to select the output clock from the first oscillator 7-1. If a signal S16 remains at a unlock notification state within a specified time after the PLL circuit 4A starts operating in the initial division ratio, the auto-clock controller 9 uses control signals S91 and S93 to set another predetermined division ratio on the first and second frequency dividers 42 and 45. As long as the signal S 16 remains in the un-lock notification state, the division ratio settings on the first and second frequency dividers are changed continuously at specified intervals.

When the signal S16 assumes a lock-notification state (match-detected state), the auto-clock controller 9 stops the operation of the first and second frequency dividers 42 and 44 that change the division ratio settings. In other words, if the first and second frequency dividers have the same division ratio, the division ratio change control by the auto-clock controller 9 stops either when the oscillation frequency of the VCO 41 matches the oscillation frequency of the first oscillator 7-1 (or the second oscillator 7-2) or when the frequency difference falls within an allowable range. At this moment, clock signals are phase-synchronized with the input digital signals at a specified frequency and are supplied to the timing regenerator 6A. Consequentially, high-quality digital signals are regenerated to a predetermined signal strength, waveform, and timing and are inputted into the E/O converter 3A.

It should be noted that after the PLL circuit 4A is locked, the auto-clock controller 9 maintains the division ratio on the first frequency divider 42 for a short period of time such as a few seconds and causes the feedback loop including the VCO 41 to run automatically even if the signal S2 from the O/E converter 2A indicates a decline in optical input or a blocked state. In this manner, when a normal optical signal is inputted again, any repetition of the PLL realignment in the above described control sequence by auto-clock controller 9 is avoided. If the decline in optical input or its blocked state exceeds a specified length of time, the auto-clock controller 9 initializes the set division ratio on the first and second frequency dividers. When an optical signal is subsequently inputted again, the auto-clock controller 9 performs the PLL re-alignment control sequence from the beginning.

If the signal S16 fails to become a lock notification state even if the set division ratios on the first and second frequency dividers are changed within a predetermined range, the auto-clock controller 9 uses a control signal S92 to direct the selector 44 to select the output clock signal from the second oscillator 7-2. Using control signals S91 and S93, the auto-clock controller 9 resets the initial division ratio on the first and second frequency dividers 42 and 45 and repeats the above-described division ratio change process at specified time intervals. In this manner, if the signals transmitted from a client terminal are for the SONET, the clock synchronization succeeds when the output clock signals from the first oscillator are selected. If the signals transmitted from a client terminal are for the Gigabit Ethernet, the clock synchronization succeeds when the output clocks from the second oscillator are selected.

In the above embodiment, the first and second oscillators share the frequency divider 45 and the phase/frequency comparator 46. Alternatively, a dedicated frequency divider 45 and a dedicated phase/frequency comparator 46 are provided for each oscillator so that the output frequencies from the PLL 4A is compared in parallel with two types of reference clock signals. In this manner, the switching back and forth between the oscillators by the auto-clock controller 9 and the repetition of the control sequence are eliminated to increase the speed of clock control.

Figure 4:
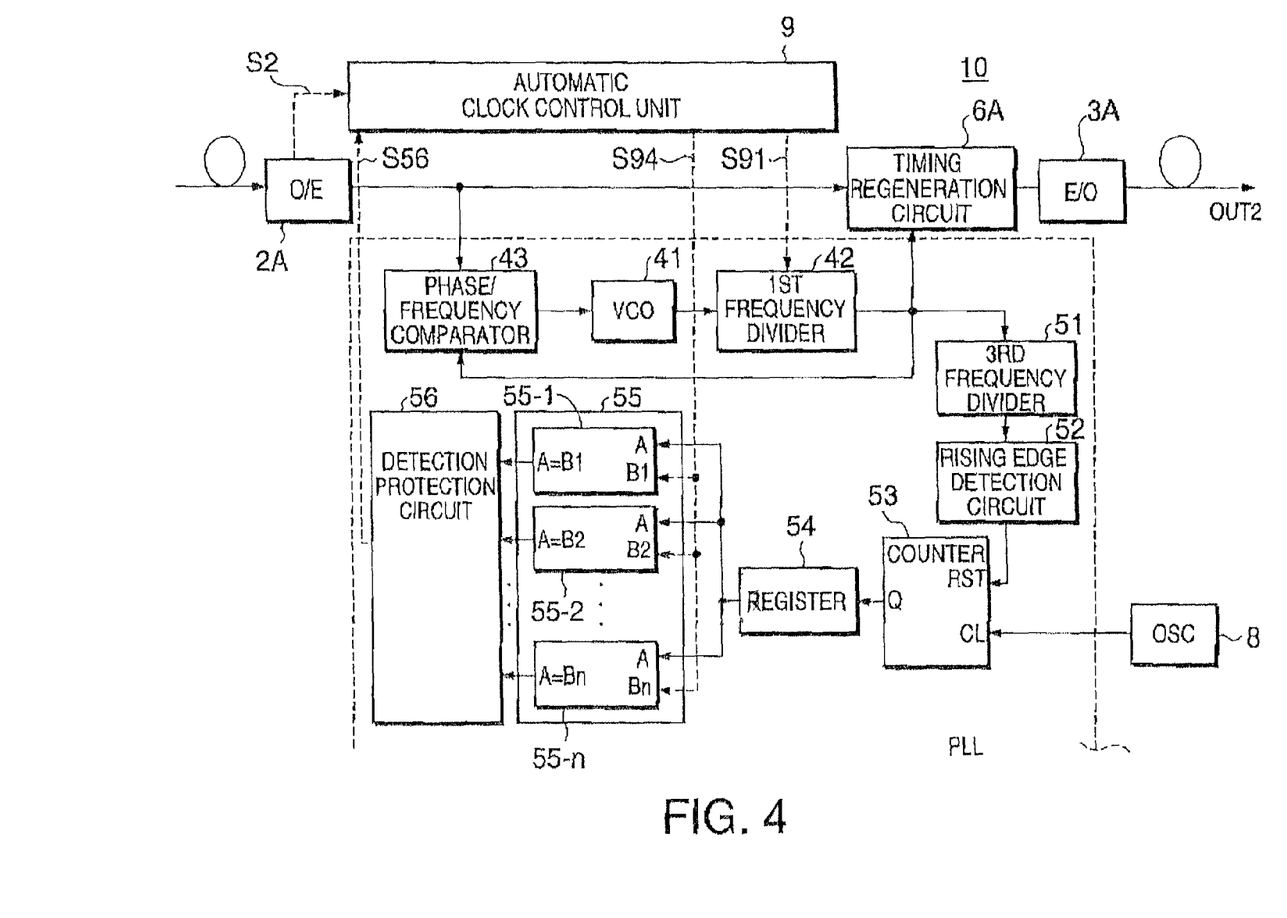
FIG. 4 is a diagram illustrating a second embodiment of the clock regenerator unit.

FIG. 4 shows a second embodiment of the clock regenerator unit 1. In this case the configuration and operation of the PLL circuit 4A are described with respect to FIG. 3 for digital signals traveling from the client equipment to the wavelength division-multiplexing apparatus. The PLL circuit 4B also has a similar configuration for digital signals traveling from the wavelength division-multiplexing apparatus to the client equipment.

The feedback loop having a VCO 41, a first frequency divider 42, and a phase/frequency comparator 43 operates in a manner similar to that in the first embodiment. In this embodiment, a third oscillator 8 is used in place of the first and second oscillators 7-1 and 7-2 of the first embodiment. The output clock signals from the first frequency divider 42 are inputted into a third frequency divider 51, where the output clock signals are further divided by a specified division ratio. The output clock signals from the third frequency divider 51 are inputted into a rise edge detector circuit 52. A clock counter 53 is reset when the output clock signals from the third frequency divider 51 rise. The clock counter 53 counts the input clock signals from a pin CK, and each time it is reset, the clock counter outputs the preceding count to a register 54. The pin CK for the clock counter 53 contains via input fundamental clock signals for a reference clock count that are generated by the oscillator 8. Therefore, the register 54 stores fundamental clock count values with different values based on the clock cycles that are outputted from the third frequency divider 51. The stored values in the register 54 are inputted into a frequency comparator 55.

A plurality of values to be compared are preset in the frequency comparator 55 by the control signal S93 from the auto-lock controller 9. In FIG. 4, the values to be compared are indicated by codes B1, B2, . . . Bn. These target comparison values B1, B2, . . . Bn are available in multiple numerical values corresponding to the clock frequencies of the signal transmission modes that is used on the wavelength division-multiplexing optical network 100. The frequency comparator 55 has a plurality of comparison functions 55-1 through 55-n. If one of the following conditions is true; A=B1, A=B2, . . . A=Bn, where A denotes a value that is stored in the register 54, the frequency comparator outputs an identification signal indicating a matched frequency to a detection protector circuit 56. Upon verifying the reliability of the frequency-indicating identification signal that is output from the frequency comparator 55, the detection protector circuit 56 posts a normal frequency identification signal S56 to the auto-lock controller 9.

If a frequency identification signal S56 is not output from the detection protector circuit 56, the auto-clock controller 9 changes the set division ratio on the first frequency divider 42 after each of the specified cycles. Because the counting period of standard clock signals by the counter 53 changes as the division ratio on the aforementioned first frequency divider 42 is changed, a count value proportional to the output clock cycle is assigned to the register 54 and the frequency divider 42. When the count value assumes a value that matches the clock frequency of the client digital signals, a frequency identification signal S56 is generated, and this signal locks the output clocks from the PLL circuit 4A.

The fundamental clock frequency for frequency calculation, generated by the oscillator 8, is approximately 150 MHz (max) for a circuit using an FPGA, for example. The input clock for the rise edge detector circuit 52 from the third frequency divider 51 should be approximately 1/16 of the 15 MHz frequency so that a non-synchronous synchronization is effected at 150 MHz. For example, if the ratio is 1/288, the resulting frequency will be 8.64 MHz for STM16, 4.34 MHz for the Gigabit Ethernet, and 2.16 MHz for STM4.

After synchronizing with the fundamental clock of the oscillator 8, the rise edge detector circuit 52 starts the rise edge detection of output pulses from the third frequency divider 51. For example, if an uncertainty bit is ±1 bit during the synchronization due to device delays and the margin bit=±1 bit, the count value that is assigned to the register 54 will be STM160, 32B9 for the Gigabit Ethernet, and 9ST75. Therefore, if target comparison values are set in the frequency comparator 55 to be B1=16, B2=35±4 and B3=72±4. Based upon the comparison of the count value in the register 54 with the above target values, the signal transmission mode is equal to STM16 if A=B1, the Gigabit Ethernet if A=B2, or STM4 if A=B3.

It should be noted that the degree of certainty of the identification frequency signal S56 is improved by adding the following frequency identification results. For example, the protection conditions by the frequency comparator 55 to the detection protector circuit 56 include that the identification frequency is committed when three consecutive matches are detected or the alignment process is resumed after resetting the match detection count if a non-match is detected five consecutive times.

According to the configuration of the above described second embodiment, a plurality of types of reference clock signals, corresponding to the signal transmission modes, are generated -by using one oscillator 8 that generates fundamental clock signals. In addition, the instantaneous comparison of the output clock frequency from the PLL with multiple types of reference clock frequencies permits the rapid supply of synchronization clock signals that are necessary for timing regeneration.

Figure 5:
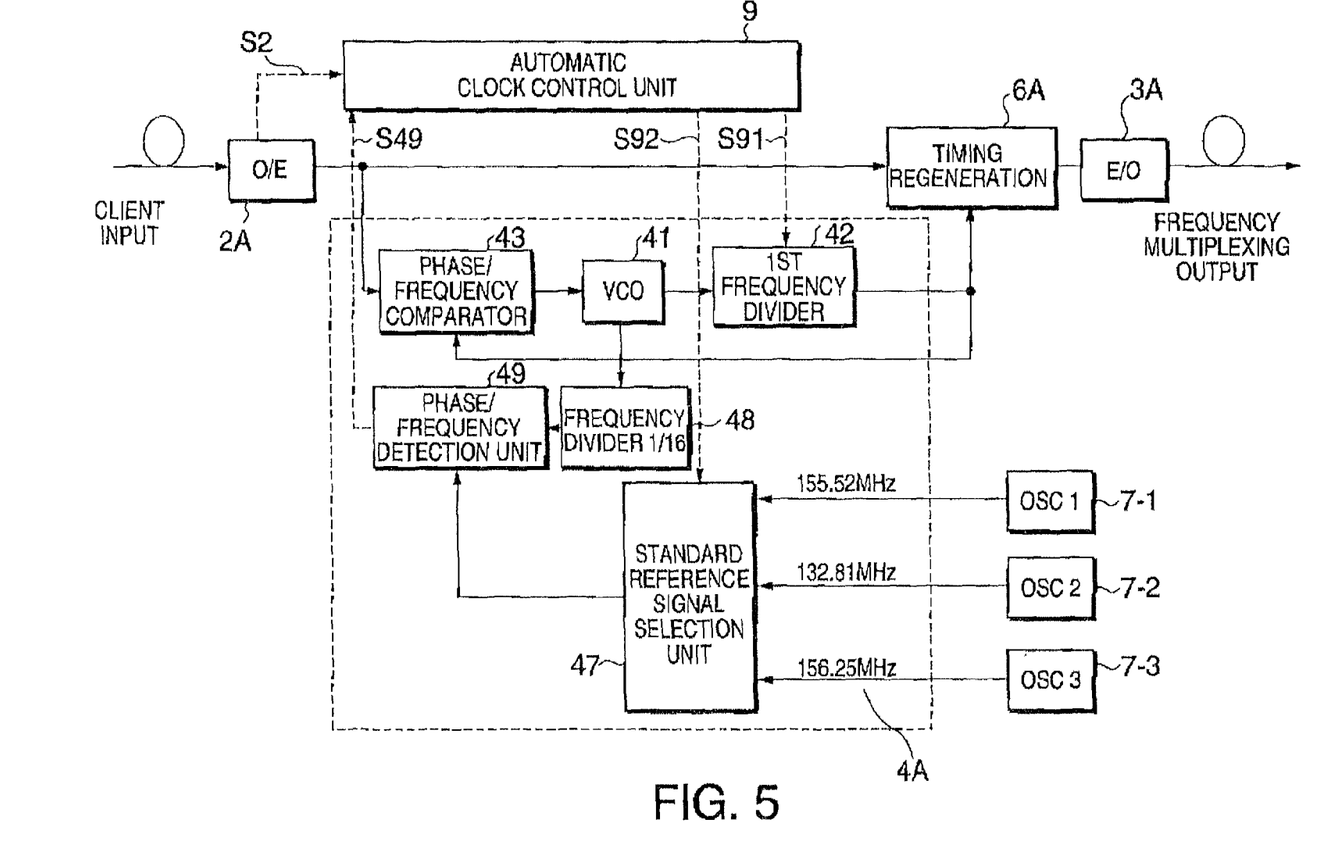
FIG. 5 is a diagram illustrating an embodiment of another auto-clock regeneration transponder.

Following is a description of another embodiment of the auto-clock regeneration transponder with reference to FIG. 5. The figure shows a configuration according to the flow of signals wherein an input optical signals from the client side is first wavelength-transformed before being sent to the wavelength division-multiplexing side. When the O/E converter 2A detects that an input optical signal level is higher than a specified level, the input optical signal from the client side notifies to the auto-clock controller 9 through an optical input detection signal S2 that the optical input has reached the normal level. Electric digital signals from the O/E converter 2A are sent to the phase/frequency comparator 43 of the PLL (phase-synchronized oscillator circuit) 4A and the timing regenerator 6A. The phase/frequency comparator 43 compares the clock signals that are the result of dividing the clock signals generate by VCO41 by a specific ratio using the frequency divider 42 according to the frequencies and phases of the electric digital signals. The phase/frequency comparator 43 converts the differences into voltages and transmits the results to the VCO 41. The VCO 41 generates clock signals corresponding to the voltages that reflects the differences. For example, the VCO 41 converts the range from 2.125 GHz to 2.67 GHz according to the input voltages values and outputs the results to the frequency divider 42. If the clock signals from the VCO 41 that is divided by the frequency divider 42 matches the electric digital signals, the signals are stabilized at that clock. In addition, the monitor output corresponding to another clock frequency of the VCO 41 is inputted into a frequency divider 48 for dividing by 16, and the resulting output clock is inputted into a phase/frequency comparator 43. The following are connected to reference standard oscillators: the 155.52 MHz frequency, which is the SONET 2.48832 GHz frequency divided by 16, to the first oscillator 7-1; the 132.81 MHz frequency, which is the Gigabit Ethernet 1.25 GHz divided by 16 to a second oscillator 7-2; and the 156.25 MHz frequency, which is the Fiber Channel 2.125 GHz frequency divided by 16 to a third oscillator 7-3. For example, the standard reference signal selector 47 initially selects the standard reference clock signals from reference clock signals coming from the first oscillator 7-1 based upon a selection signal from the auto-clock controller 9. The phase/frequency difference detector 48 compares the output clock signals from the preceding frequency divider 48 with the standard reference clock signal that was selected as a standard reference signal. If the two clock signals agree, the phase/frequency difference detector 49 sends a notification S49 to the auto-clock controller 9, indicating that the synchronization should be provided with a clock-locking request. If the two clocks have a difference greater than the allowable deviation, a notification signal S49 indicating that a clock-unlocking request is provided.

Figure 6:
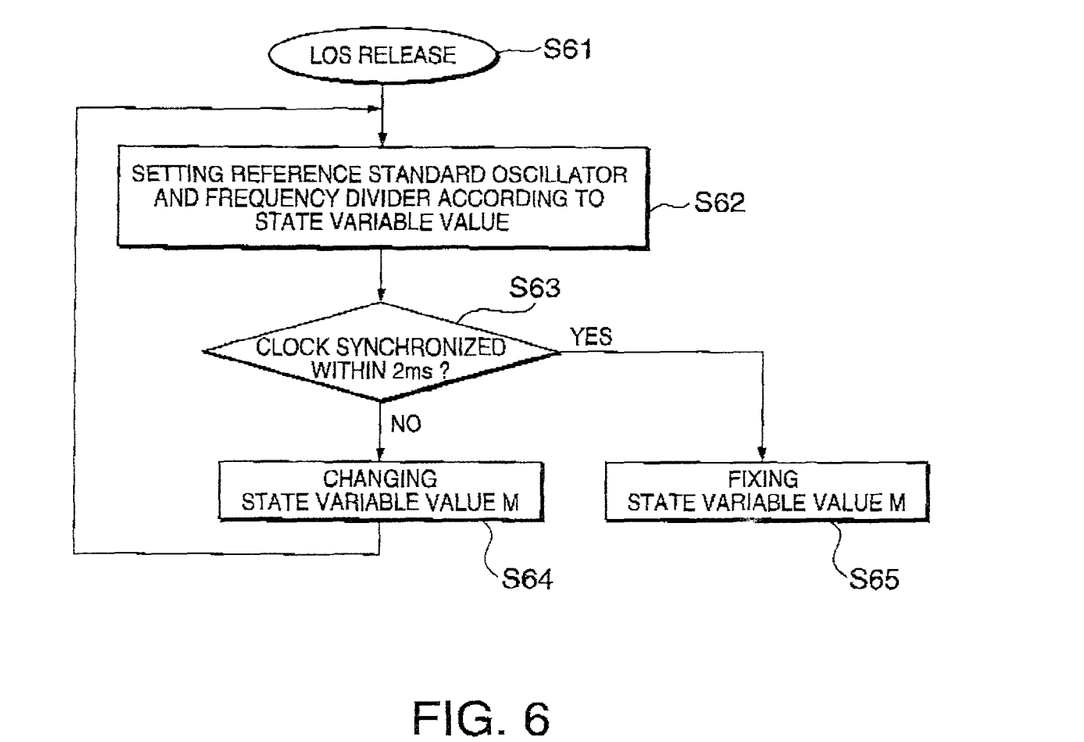
FIG. 6 is a flowchart illustrating the auto-clock switching control in another embodiment of the auto-clock regeneration transponder.
Figure 7:
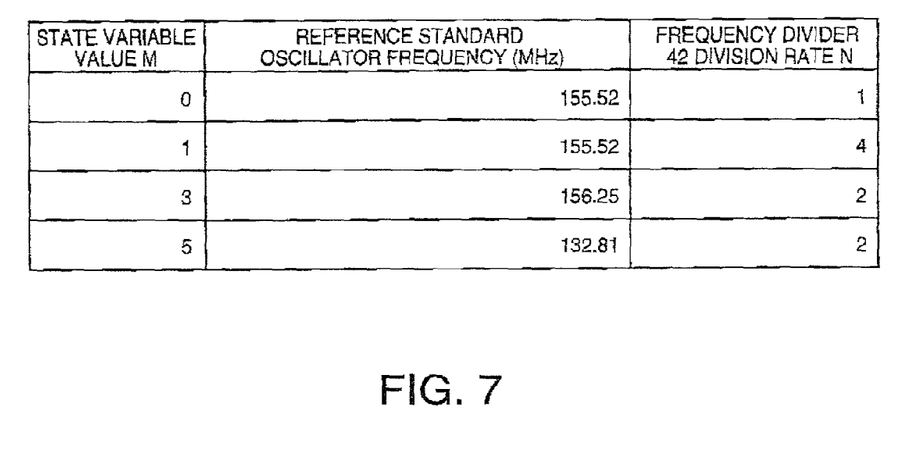
FIG. 7 is a table of state variable assignments for another embodiment of the auto-clock regeneration transponder.

Following is a description of the sequence by which a clock is automatically selected. FIG. 6 is a flowchart that describes steps involved in the auto-clock setting in one preferred process according to the current invention. When the O/E converter 2A detects a normal optical input, in a step S16 LOS (Loss of Signal) release notice S2 is sent to the auto-clock controller 9, and a LOS release state is effected. The CPU in the auto-clock controller 9 controls in such a way that it sets for the selector 47 and the frequency divider 42 as a standard reference oscillator in a step S62 according to a value M of the state variable for LOS release 61 shown in FIG. 7. When an optical signal detection signal is received from the O/E converter 2A, a setting signal S91 sets the frequency divider 42 at an initial division ratio. Similarly, an instruction is also given to the selector 47 using a setting signal S92 so that selector 47 selects an initial selection such as the selection of a reference clock from the first oscillator 7-1 that oscillates at 155.52 MHz corresponding to a SONET system. When the power is turned on, a frequency for the reference standard oscillator corresponds to the state variable M being zero as shown in FIG. 7, so that the 155.52

MHz frequency, which is the STM-16/OC-48 frequency divided by 16, is selected. In the meantime, the ratio frequency divider 42, is set with the frequency at 2.4883232 GHz with a division ratio N equal to 1. When the initial settings are effected, the LOS release (step 61) ensues, and during the passage of a specified time such as 2 ms, a signal S94 from the phase/frequency comparator 43 is posted on the auto-clock controller 9 to test whether or not the locking is effected in a step S63. If the locking is not effected, the auto-clock controller 9 performs the action described in a step S64 to change the next state variable M to 1, and to move to the next setting in the step S62. At M=1, with the frequency of the reference standard oscillator fixed at 155.52 MHz, the division ratio N for the frequency divider 42 is set to 4 to have a 622.08 MHz frequency in the step S62. After the passage of 2 ms, a signal S94 from the phase/frequency difference detector 48 is posted on the auto-clock controller 9, and a test is made to determine whether or not the locking is effected in the step S63. In this manner, the setting and testing operations are repeated for each state variable. When the state variable M is equal to 3, the frequency of the reference standard oscillator is set to the $\frac{1}{16}$ division frequency of the GbE (Gigabit Ethernet) at 156.25 MHz. The frequency divider 42 is set to 1250 MHz, using a division ratio of N=2. If a clock synchronization still fails, the state variable is set to M=5, and the frequency of the reference standard oscillator is set to the $\frac{1}{16}$ division frequency of the 2.12 GBd Fibre Channel, which is 132.81 MHz, and the frequency divider 42 is set to 1062.5 MHz, using a division ratio of N=2. If this still fails to effect a synchronization, a value 2125 MHz corresponding to the state variable M=5. The above sequence is basically repeated while a specific optical input remains in a LOS released state. If the notification S94 from the result of clock synchronization testing affirmatively indicates synchronization, the state variable is fixed, and the selected value for the reference standard oscillator for the clock regeneration circuit and the division ratio N are fixed in a step S65. In this state, the output from the timing regenerator circuit 6A results in an enhanced level of the clock precision due to normal timing regeneration operations, and the signals regenerated using that clock are transmitted to the electric/optical converter 3A, where they are outputted as single-wavelength signals among wavelength division-multiplexed optical signals. On the other hand, if no locking is achieved after the state variable M as shown in FIG. 7 has undergone a complete cycle, the process is repeated from the M=0 state. The operation is performed until locking is attained. If optical input is disrupted and then resumed, the value of the state variable M reflecting the previous synchronization condition is retained. The operation is commenced from a setting value that corresponds to the value of M. If there is no optical signal to the O/E converter 2A after the passage of a specified time such as 10 seconds and an input detection signal S94 is not generated, or the power for the transponder is turned on, the state variable M returns to its initial setting. When receiving an LOS release notice, the auto-clock controller 9 initializes all the various settings. When an optical input is received in a subsequent step, the clock-setting sequence is commenced from the beginning.

The above is a description of the auto-clock setting sequence corresponding to an optical input from the client side. The auto-clock setting process corresponding to the optical input from the wavelength division-multiplexing side to the transponder involves a similar sequence.

As may be clear from the above description, the present invention automatically identifies a frequency that matches the signal transmission mode adopted by the client equipment and generating synchronization clock signals for the regeneration, thereby eliminating the need for manual frequency setting. In this manner, the present invention permits optical network systems to rapidly accommodate connection changes on the part of the client equipment.

What is claimed is:

1. A wavelength converter comprising:
   an optical/electrical signal converter for converting an input optical signal into an electrical digital signal;
   a clock generation unit connected to said optical/electrical signal converter and receiving reference clock signals each having a predetermined frequency indicating a transmission mode for automatically identifying one of at least two predetermined signal transmission modes for the electrical digital signal and generating a phase-synchronized clock signal with the corresponding frequency that matches the identified signal transmission mode based upon one of the reference clock signals;
   a timing regeneration circuit connected to said clock generation unit for regenerating a clock timing for the electrical digital signal based upon the phase-synchronized clock signal that is generated from said clock generation unit;
   an electrical/optical converter connected to said timing regeneration circuit for converting the electrical digital signal that is outputted from said timing regeneration circuit into an optical signal with a specified wavelength for wavelength-division multiplexed transmission; and
   a controller connected to said clock generation unit for controlling said clock generation unit for selecting the one the reference clock signals that corresponds to the identified signal transmission mode.

2. The wavelength converter according to claim 1, further comprising:
   oscillators connected to said clock generation unit for each generating one of the reference clock signals.

3. A wavelength converter comprising:
   an optical/electrical signal converter that converts input optical signals into electrical digital signals;
   a phase-synchronized oscillator circuit storing a few reference clocks each corresponding to a signal transmission mode of the electrical digital signals for generating clock signal having an output clock frequency according to a transmission mode of the electrical digital signal based upon one of the reference clocks and clock timing of the electrical digital signal from said optical/electrical signal converter, said phase-synchronized oscillator being phase-controlled according to the electrical digital signals;
   a timing regeneration circuit connected to said phase-synchronized oscillator for regenerating a clock timing signal for the electrical digital signals based upon the clock signal that is generated from said phase-synchronized oscillator circuit;
   an electrical/optical converter connected to said timing regeneration circuit for converting the electrical digital signals that are outputted from said timing regeneration circuit into optical signals of a specified wavelength; and
   an auto-clock controller connected to said phase-synchronized oscillator circuit for controlling the clock signal of said phase-synchronized oscillator circuit in selecting one of the reference clocks that corresponds to a transmission mode of the electrical digital signal which has been converted by said optical/electrical signal converter based upon a comparison between the reference clocks and the clock signals generated from said phase-synchronized oscillator circuit.

4. The wavelength converter according to claim 3 further comprising:
   means for generating a plurality of reference clock signals of predetermined frequencies according to the signal transmission mode; and
   means for detecting a matched pair of one of said reference clock signals and said clock signal to generate a match detection signal,
wherein said auto-clock controller locks the output clock frequency of said phase-synchronized oscillator circuit according to the match detection signal from said detection means.

5. An optical communication apparatus comprising:
   a first clock generation circuit receiving reference clock signals each having a predetermined frequency indicating a transmission mode of a transmission digital signal for automatically identifying the transmission mode for the transmission digital signal and for generating a phase-synchronized clock signal with a specified frequency based upon one of the reference clock signals;
   a first timing regeneration circuit connected to said first clock generation circuit for regenerating clock timing for the transmission digital signal based upon the phase-synchronized clock signals from said first clock generation circuit;
   a first electrical/optical converter connected to said first timing regeneration circuit for converting the transmission digital signal from said first timing regeneration circuit into first optical signals at a specified wavelength, said first electrical/optical converter transmitting the optical signals to an optical network node;
   a first optical/electrical converter connected to the optical network node for converting the optical signals at a specified wavelength that are received from said optical network node into electrical, received digital signals;
   a second clock generation circuit connected to said first optical/electrical converter receiving the reference clock signals for automatically identifying the transmission mode for the electrical digital signals from said optical/electrical signal converter and for generating a second phase-synchronized clock signal at the specified frequency that matches the signal transmission mode of the electrical received digital signal based upon one of the reference clock signals;
   a second timing regeneration circuit connected to said second clock generation circuit for regenerating the clock timing for the electrical received digital signals based upon the second phase-synchronized clock signal from said second clock generation circuit; and
   a controller connected to said first clock generation unit and said second clock generation unit for controlling said first clock generation unit for selecting the one of the reference clock signals that corresponds to the identified signal transmission mode of the transmission digital signal and for controlling said second clock generation unit for selecting the reference clock signal that corresponds to the identified signal transmission mode of the received electrical digital signal.

6. The optical communication apparatus according to claim 5 further comprising:
   client equipment connected to said second timing regeneration circuit;
   a second optical/electrical signal converter connected to said client equipment for converting the transmission optical signals received from said client equipment into the transmission digital signals; and
   a second electrical/optical converter connected to said second timing regeneration circuit for converting the electrical received digital signals from said second timing regeneration circuit into second optical signals and for transmitting the second optical signals to the client equipment.

7. The wavelength converter according to claim 5, further comprising:
   oscillators connected to said clock generation unit for each generating one of the reference clock signals.

8. A wavelength division-multiplexing optical communication apparatus comprising:
   transponders each further comprising:
      a clock generation circuit receiving reference clock signals each having a predetermined frequency according to a transmission mode of a transmission digital signal for automatically identifying one of at least two predetermined signal transmission modes for the transmission digital signal and for generating a phase-synchronized clock signal with a specified frequency based upon one of the reference clock signals;
      a timing regeneration circuit for regenerating clock timing of the transmission digital signal based upon the phase-synchronized clock signal from said clock generation circuit;
      an electrical/optical converter connected to said timing regeneration circuit for converting the transmission digital signal from said timing regeneration circuit into an optical signal at a specified wavelength;
      a controller connected to said clock generation circuit for controlling said clock generation unit for selecting the one of the reference clock signals that corresponds to a transmission mode of the transmission digital signal; and
   a wavelength division-multiplexing optical transmission equipment connected to said electrical/optical converter of said transponders for wavelength-multiplexing the optical signals from said electrical/optical converter with optical signals at other wavelengths and for transmitting the optical signals to an optical network.

9. The wavelength converter according to claim 8, further comprising:
   oscillators connected to said clock generation unit for each generating one of the reference clock signals.

10. A wavelength division-multiplexing optical communication apparatus comprising:
    a wavelength separator for separating a first optical signal of a specified wavelength from wavelength-multiplexed optical signals that are received from an optical network;
    an optical/electrical signal converter connected to said wavelength separator for converting the first optical signal of a specified wavelength received from said wavelength separator into an electrical digital signal;
    a clock generator circuit connected to said optical/electrical signal converter receiving reference clock signals each having a predetermined frequency according to a transmission mode of a an electrical digital signal automatically identifying one of at least two predetermined signal transmission modes for the electrical digital signal from said optical/electrical signal converter and for generating a phase-synchronized clock signal with a specified frequency based upon one of the reference clock signals and clock timing of the electrical digital signal from said optical/electrical signal converter;

a timing regeneration circuit connected to said clock generator circuit for regenerating clock timing for the electrical digital signal based upon the phase-synchronized clock signal from said clock generator circuit;

an electrical/optical converter connected to said timing regeneration circuit for converting the electrical digital signal from said timing regeneration circuit into a second optical signal of a specified wavelength; and a controller connected to said clock generator circuit for controlling said clock generation unit for selecting the one of the reference clock signals that corresponds to a transmission mode of the electrical digital signal converted by said optical/electric converter.

11. The wavelength according to claim 10, further comprising:

oscillators connected to said clock generation unit for each generating one of the reference clock signals.

12. A wavelength converter comprising:

an optical/electrical signal converter for converting input optical signals into electric digital signals;

a clock generation unit connected to said optical/electrical signal converter for automatically identifying one of at least two predetermined signal transmission modes for the electrical digital signals and generating phase-synchronized clock signals with a specified frequency that matches the identified signal transmission mode;

a timing regeneration circuit connected to said clock generation unit for regenerating a clock timing for the electrical digital signals based upon the phase-synchronized clock signals that are generated from said clock regeneration unit;

an electrical/optical converter connected to said timing regeneration circuit for converting the electrical digital signals that are outputted from said timing regeneration circuit into optical signals with a specified wavelength for wavelength-division multiplexed transmission, wherein said clock generation unit further comprises:

an oscillator for generating predetermined phase-controlled clock signals for the electrical digital signals;

a frequency divider for dividing the phase-controlled clock signals from said oscillator to generate an output clock frequency; and an auto-clock controller connected to said frequency divider for changing and controlling a division ratio for said frequency divider so that the auto-clock controller locks the division ratio of said frequency divider when the output clock frequency of said frequency divider indicates a specific match with a reference clock frequency that depends on the transmission mode for said electrical digital signals.

13. A wavelength converter comprising:

an optical/electrical signal converter that converts input optical signals into electrical digital signals;

a phase-synchronized oscillator circuit for generating clock signals each having an output clock frequency according to a transmission mode, said phase-synchronized oscillator being phase-controlled according to the electrical digital signals;

a timing regeneration circuit connected to said phase-synchronized oscillator for regenerating a clock timing signal for the electrical digital signals based upon the clock signals that are generated from said phase-synchronized oscillator circuit;

an electrical/optical converter connected to said timing regeneration circuit for converting the electrical digital signals that are outputted from said timing regeneration circuit into optical signals of a specified wavelength; and an auto-clock controller connected to said phase-synchronized oscillator circuit for controlling the clock signal of said phase-synchronized oscillator circuit based upon a comparison between a reference clock corresponding to a signal transmission mode of the electrical digital signals and the clock signals, wherein said phase-synchronized oscillator circuit further comprises:

a voltage control oscillator;

a first frequency divider with a variable division ratio connected to said voltage control oscillator for dividing an output clock from said voltage control oscillator and outputs output clock signals from said phase-synchronized oscillator circuit; and a phase frequency comparator connected to said first frequency divider for controlling said voltage control oscillator according to a comparison between the output clock signals from said first frequency divider and said electrical digital signals, whereby said auto-clock controller changes and controls the variable division ratio for said first frequency divider, and when the comparison between the reference clock and the output clock signal from said first frequency divider assumes a state, the auto-clock controller locks the division ratio for said first frequency divider.

14. A wavelength converter comprising:

an optical/electrical signal converter that converts input optical signals into electrical digital signals;

a phase-synchronized oscillator circuit for generating clock signals each having an output clock frequency according to a transmission mode, said phase-synchronized oscillator being phase-controlled according to the electrical digital signals;

a timing regeneration circuit connected to said phase-synchronized oscillator for regenerating a clock timing signal for the electrical digital signals based upon the clock signals that are generated from said phase-synchronized oscillator circuit;

an electrical/optical converter connected to said timing regeneration circuit for converting the electrical digital signals that are outputted from said timing regeneration circuit into optical signals of a specified wavelength; and an auto-clock controller connected to said phase-synchronized oscillator circuit for controlling the clock signal of said phase-synchronized oscillator circuit based upon a comparison between a reference clock corresponding to a signal transmission mode of the electrical digital signals and the clock signals, wherein said phase-synchronized oscillator circuit further comprises:

a plurality of oscillators of different oscillation frequencies for generating output clock signals signal transmission modes;

a frequency divider for dividing the output clock signal from one of said oscillators selected by said auto-clock controller with a division ratio specified by said auto-clock controller; and a detector detecting a matching state between the reference clock that is output from said frequency divider and said output clock signal, whereby said auto-clock controller locks the output clock frequency from said phase-synchronized oscillator circuit according to the match detection signal from said detector.

15. A wavelength converter comprising:

an optical/electrical signal converter that converts input optical signals into electrical digital signals;

a phase-synchronized oscillator circuit for generating clock signals each having an output clock frequency according to a transmission mode, said phase-synchronized oscillator being phase-controlled according to the electrical digital signals;

a timing regeneration circuit connected to said phase-synchronized oscillator for regenerating a clock timing signal for the electrical digital signals based upon the clock signals that are generated from said phase-synchronized oscillator circuit;

an electrical/optical converter connected to said timing regeneration circuit for converting the electrical digital signals that are outputted from said timing regeneration circuit into optical signals of a specified wavelength; and an auto-clock controller connected to said phase-synchronized oscillator circuit for controlling the clock signal of said phase-synchronized oscillator circuit based upon a comparison between a reference clock corresponding to a signal transmission mode of the electrical digital signals and the clock signals, wherein said phase-synchronized oscillator circuit further comprises:

an oscillator for generating fundamental clock signals;

a counter for counting said fundamental clock signals in a counting period that is proportional to a cycle of the clock signals from said phase-synchronized oscillator circuit; and a comparison means for comparing the count value obtained by said counter with a reference clock count that is pre-stored according to the signal transmission mode to generate a match detection signal;

whereby said auto-clock controller locks the output clock frequency in said phase-synchronized oscillator circuit according to the match detection signal from said comparison means.

* * * * *